United States Patent
Higa et al.

(10) Patent No.: US 11,482,838 B2
(45) Date of Patent: Oct. 25, 2022

(54) OPTICAL WAVEGUIDE STRUCTURE

(71) Applicant: FURUKAWA ELECTRIC CO., LTD., Tokyo (JP)

(72) Inventors: Yasutaka Higa, Tokyo (JP); Yasumasa Kawakita, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 17 days.

(21) Appl. No.: 16/532,696

(22) Filed: Aug. 6, 2019

(65) Prior Publication Data
US 2019/0363516 A1    Nov. 28, 2019

Related U.S. Application Data

(63) Continuation of application No. PCT/JP2018/004124, filed on Feb. 7, 2018.

(30) Foreign Application Priority Data

Feb. 7, 2017    (JP) .............................. JP2017-020621

(51) Int. Cl.
*H01S 5/227*    (2006.01)
*H01S 5/06*    (2006.01)
(Continued)

(52) U.S. Cl.
CPC ............ *H01S 5/227* (2013.01); *H01S 5/0612* (2013.01); *H01S 5/06255* (2013.01);
(Continued)

(58) Field of Classification Search
CPC .... H01S 5/1007; H01S 5/1014; H01S 5/2205; H01S 5/2213–2216; H01S 5/227–24; G02B 2006/121; G02B 2006/12097
See application file for complete search history.

(56) References Cited

U.S. PATENT DOCUMENTS 4,759,023 A * 7/1988 Yamaguchi ........... H01S 5/0265
257/184
5,082,799 A * 1/1992 Holmstrom ....... H01L 21/30612
257/E21.22
(Continued)

FOREIGN PATENT DOCUMENTS

CN    102474069 A    5/2012
CN    105075038 A    11/2015
(Continued)

OTHER PUBLICATIONS

International Search Report dated Apr. 10, 2018 in PCT/JP2018/004124 filed Feb. 7, 2018 (with English Translation).
(Continued)

*Primary Examiner* — Joshua King
(74) *Attorney, Agent, or Firm* — Oblon, McClelland, Maier & Neustadt, L.L.P.

(57) ABSTRACT

An optical waveguide structure includes a lower cladding layer positioned on a substrate; an optical guide layer positioned on the lower cladding layer; an upper cladding layer positioned on the optical guide layer; and a heater positioned on the upper cladding layer. The lower cladding layer, the optical guide layer, and the upper cladding layer constitute a mesa structure. The optical guide layer has a lower thermal conductivity than the upper cladding layer. An equation "$W_{wg} \leq W_{mesa} \leq 3 \times W_{wg}$" is satisfied, wherein $W_{mesa}$ represents a mesa width of the mesa structure, and $W_{wg}$ represents a width of the optical guide layer. The optical guide layer occupies one-third or more of the mesa width in a width direction of the mesa structure.

14 Claims, 6 Drawing Sheets

(51) Int. Cl.
*H01S 5/12* (2021.01)
*H01S 5/10* (2021.01)
*H01S 5/14* (2006.01)
*H01S 5/0625* (2006.01)
*H01S 5/125* (2006.01)
*H01S 5/22* (2006.01)
*H01S 5/343* (2006.01)
*H01S 5/026* (2006.01)

(52) U.S. Cl.
CPC ........ *H01S 5/06256* (2013.01); *H01S 5/1007* (2013.01); *H01S 5/12* (2013.01); *H01S 5/125* (2013.01); *H01S 5/142* (2013.01); *H01S 5/0261* (2013.01); *H01S 5/1014* (2013.01); *H01S 5/1032* (2013.01); *H01S 5/2206* (2013.01); *H01S 5/3434* (2013.01)

(56) References Cited

U.S. PATENT DOCUMENTS

| | | | | |
|---|---|---|---|---|
| 5,222,091 | A * | 6/1993 | Holmstrom | H01L 21/30612 257/E21.22 |
| 6,226,310 | B1 * | 5/2001 | Takagi | H01S 5/0265 372/50.11 |
| 6,396,854 | B1 * | 5/2002 | Takagi | B82Y 20/00 356/496 |
| 6,977,953 | B2 * | 12/2005 | Hata | H01S 5/04254 372/46.01 |
| 7,859,745 | B2 * | 12/2010 | Tanaka | H01S 5/5009 359/344 |
| 8,236,589 | B2 | 8/2012 | Matsui et al. | |
| 8,488,637 | B2 * | 7/2013 | Fukuda | H01S 5/4087 372/20 |
| 10,193,305 | B2 | 1/2019 | Kawakita et al. | |
| 2002/0141682 | A1 * | 10/2002 | Ryu | G02B 6/1228 385/14 |
| 2005/0185689 | A1 | 8/2005 | Clark et al. | |
| 2007/0230523 | A1 | 10/2007 | Ishikawa | |
| 2008/0137180 | A1 * | 6/2008 | Oh | G02B 6/1228 359/344 |
| 2010/0303115 | A1 * | 12/2010 | Yagi | H01S 5/2231 372/46.012 |
| 2011/0085572 | A1 * | 4/2011 | Dallesasse | H01S 5/1007 372/20 |
| 2011/0305255 | A1 * | 12/2011 | Ishimura | H01S 5/026 372/50.1 |
| 2012/0128375 | A1 * | 5/2012 | Kimoto | G02B 6/12004 398/201 |
| 2012/0321244 | A1 * | 12/2012 | Suzuki | H01S 5/1014 385/14 |
| 2013/0003762 | A1 * | 1/2013 | Kaneko | H01S 5/06256 372/20 |
| 2013/0122623 | A1 * | 5/2013 | Matsumoto | H01S 5/04252 438/34 |
| 2013/0136391 | A1 * | 5/2013 | Takiguchi | H01S 5/026 385/14 |
| 2013/0235890 | A1 * | 9/2013 | Creazzo | H01S 5/1007 372/20 |
| 2013/0272326 | A1 * | 10/2013 | Yamatoya | H01S 5/04257 372/26 |
| 2015/0132002 | A1 * | 5/2015 | Krishnamurthy | H01S 5/1007 398/79 |
| 2015/0357792 | A1 | 12/2015 | Kobayashi | |
| 2016/0218484 | A1 * | 7/2016 | Lealman | H01S 3/1055 |
| 2016/0268768 | A1 * | 9/2016 | Matsumoto | H01S 5/2226 |
| 2020/0379174 | A1 * | 12/2020 | Prosyk | H01S 5/2086 |

FOREIGN PATENT DOCUMENTS

| | | | | |
|---|---|---|---|---|
| JP | H0653606 | A | * | 2/1994 |
| JP | 06-97604 | A | | 4/1994 |
| JP | 07106691 | A | * | 4/1995 |
| JP | 08279648 | A | * | 10/1996 |
| JP | 11-54841 | A | | 2/1999 |
| JP | 2007-025583 | A | | 2/2007 |
| JP | 2012-174938 | A | | 9/2012 |
| JP | 2013165123 | A | * | 9/2012 |
| JP | 2013165123 | A | * | 8/2013 |
| JP | 2013-172026 | A | | 9/2013 |
| JP | 5303580 | B2 | | 10/2013 |
| JP | 2015-012176 | A | | 1/2015 |
| JP | 2016-054168 | A | | 4/2016 |
| WO | 99/031774 | A1 | | 6/1999 |
| WO | WO 2016/152274 | A1 | | 9/2016 |

OTHER PUBLICATIONS

Written Opinion dated Apr. 10, 2018 in PCT/JP2018/004124 filed Feb. 7, 2018.
Combined Chinese Office Action and Search Report dated May 8, 2020, in Patent Application No. 201880009829.4 (with English translation), citing documents AA, AO and AP therein, 14 pages
Japanese Office Action dated Dec. 7, 2021 in Japanese Patent Application No. 2018-567454 w/English machine translation, citing document AO therein, 11 pages.

* cited by examiner

OPTICAL WAVEGUIDE STRUCTURE

CROSS-REFERENCE TO RELATED APPLICATION(S)

This application is a continuation of International Application No. PCT/JP2018/004124, filed on Feb. 7, 2018 which claims the benefit of priority of the prior Japanese Patent Application No. 2017-020621, filed on Feb. 7, 2017, the entire contents of which are incorporated herein by reference.

BACKGROUND

The present disclosure relates to an optical waveguide structure.

Regarding a semiconductor laser device that includes an optical waveguide structure, a technology for varying the laser emission wavelength is known in which the refractive indexes of an optical guide layer and a diffraction grating layer, which constitute the optical waveguide structure, are varied by heating the optical waveguide structure using a heater (for example, International Patent Publication No. 2016/152274). In order to enhance the heating efficiency of a heater, technologies for providing a low thermal conductivity layer or a low thermal conductivity area between the optical guide layer and the substrate have been disclosed in Japanese Laid-open Patent Publication No. 2015-12176, Japanese Patent No. 5303580, and U.S. Pat. No. 8,236,589.

As also disclosed in Japanese Laid-open Patent Publication No. 2015-12176, Japanese Patent No. 5303580, and U.S. Pat. No. 8,236,589; there has been a demand for enhancing the heating efficiency of a heater.

SUMMARY

According to an aspect of the present disclosure, an optical waveguide structure is provided which includes a lower cladding layer positioned on a substrate; an optical guide layer positioned on the lower cladding layer; an upper cladding layer positioned on the optical guide layer; and a heater positioned on the upper cladding layer. The lower cladding layer, the optical guide layer, and the upper cladding layer constitute a mesa structure. The optical guide layer has a lower thermal conductivity than the upper cladding layer. In the optical waveguide structure, an equation "$W_{wg} \leq W_{mesa} \leq 3 \times W_{wg}$" is satisfied, wherein $W_{mesa}$ represents a mesa width of the mesa structure, and $W_{wg}$ represents a width of the optical guide layer. The optical guide layer occupies one-third or more of the mesa width in a width direction of the mesa structure.

The above and other objects, features, advantages and technical and industrial significance of this disclosure will be better understood by reading the following detailed description of presently preferred embodiments of the disclosure, when considered in connection with the accompanying drawings.

DETAILED DESCRIPTION

Figure 1:
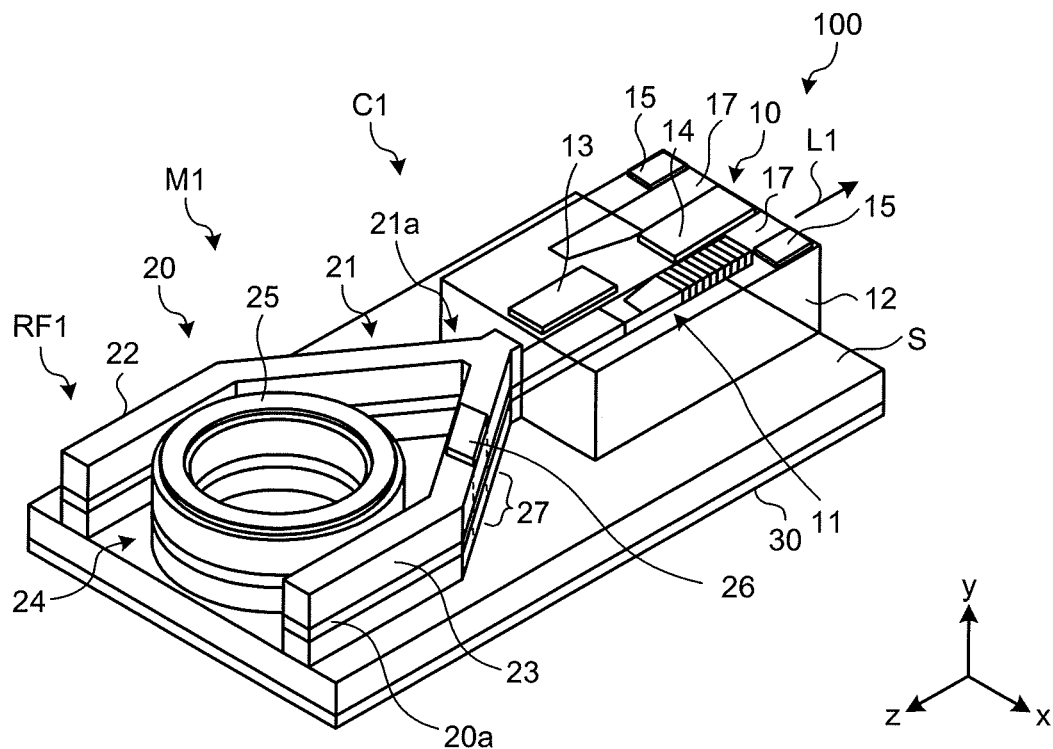
FIG. 1 is a schematic diagram illustrating a configuration of a wavelength-tunable laser device that includes an optical waveguide structure according to an embodiment.

An exemplary embodiment of the present disclosure is described below with reference to the accompanying drawings. However, the present disclosure is not limited by the embodiment described below. In the drawings, identical or corresponding constituent elements are referred to by the same reference numerals. Moreover, each drawing is schematic in nature, and it needs to be kept in mind that the relationships among the dimensions of the elements or the ratio of the elements may be different than the actual situation. Among the drawings too, there may be portions having different relationships among the dimensions or having different ratios. Moreover, in the drawings, the x-coordinate axis, the y-coordinate axis, and the z-coordinate axis are indicated as necessary, and the directions are explained with reference to those axes.

Embodiment

FIG. 1 is a schematic diagram illustrating a configuration of a wavelength-tunable laser device that includes an optical waveguide structure according to an embodiment. A wavelength-tunable laser device 100 includes a first optical waveguide portion 10 and a second optical waveguide portion 20 that are formed on a common base S. Herein, the base S is made of the n-type InP, for example. Moreover, on the underside surface of the base S, an n-side electrode 30 is formed. The n-side electrode 30 is made of AuGeNi, for example; and makes an ohmic contact with the base S.

The first optical waveguide portion 10 includes a semiconductor mesa portion 12 with an optical waveguide 11; includes a p-side electrode 13; includes a micro heater 14 made of titanium (Ti); and includes two electrode pads 15. The first optical waveguide portion 10 has a buried structure, and the optical waveguide 11 is formed to extend in the z-direction inside the semiconductor mesa portion 12. The semiconductor mesa portion 12 is configured by layering InP semiconductor layers, and functions as a cladding portion with respect to the optical waveguide 11.

Figure 2:
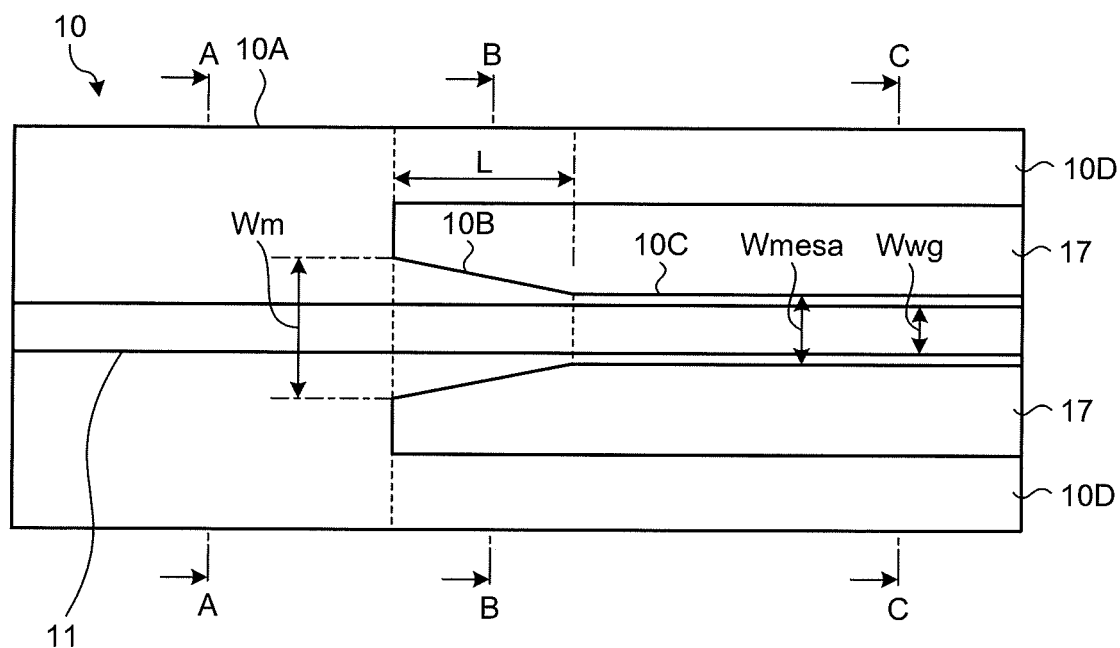
FIG. 2 is an upper view of a first optical waveguide portion illustrated in FIG. 1.

FIG. 2 is an upper view of the first optical waveguide portion 10. In FIG. 2, the p-side electrode 13, the micro heater, and the electrode pads 15 are not illustrated. The first optical waveguide portion 10 includes a first optical waveguide structure portion 10A, a second optical waveguide structure portion 10B, a third optical waveguide structure portion 10C, and two supporting mesa portions 10D. The first optical waveguide structure portion 10A, the second optical waveguide structure portion 10B, and the third optical waveguide structure portion 10C are connected in that order. Moreover, in between the pair of the second optical waveguide structure portion 10B and the third optical waveguide structure portion 10C and the two supporting mesa portions 10D, insulating members 17 are disposed. The insulating members 17 are made of polyimide, for example.

In the semiconductor mesa portion 12 of the first optical waveguide structure portion 10A, the p-side electrode 13 is disposed along the optical waveguide 11. Meanwhile, in the semiconductor mesa portion 12, an SiN protective film (described later) is formed, and the p-side electrode 13 makes contact with the semiconductor mesa portion 12 via an opening formed on the SiN protective film. In the semiconductor mesa portion 12 of the third optical waveguide structure portion 10C, the micro heater 14 is disposed on the SiN protective film and along the optical waveguide 11. In the semiconductor mesa portion 12 of the supporting mesa portions 10D, the electrode pads 15 are disposed on the SiN protective film. The electrode pads 15 are connected to the micro heater 14 via a wiring pattern (not illustrated) provided on the insulating members 17. Thus, the micro heater 14 receives the supply of electrical current via the electrode pads 15 and consequently gets heated.

Figure 3A:
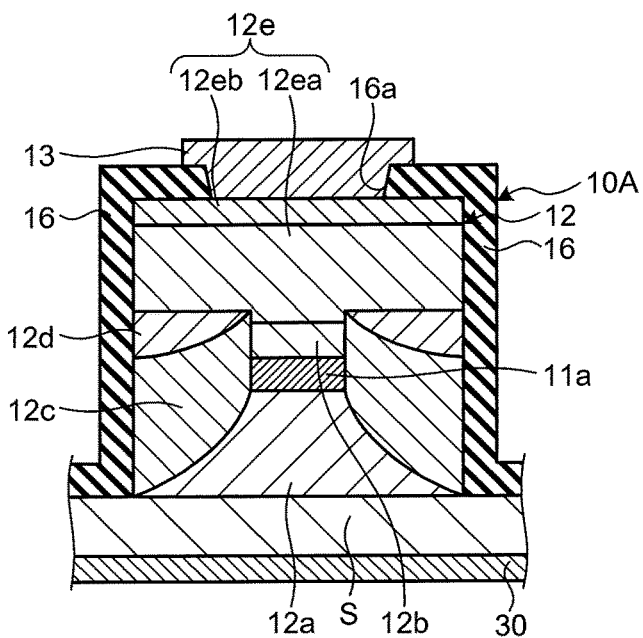
FIG. 3A is a cross-sectional view along A-A line illustrated in FIG. 2.
Figure 3B:
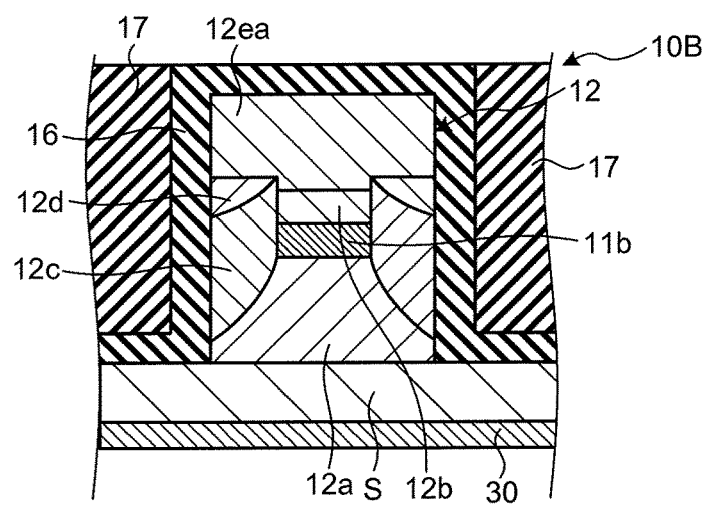
FIG. 3B is a cross-sectional view along B-B line illustrated in FIG. 2.
Figure 3C:
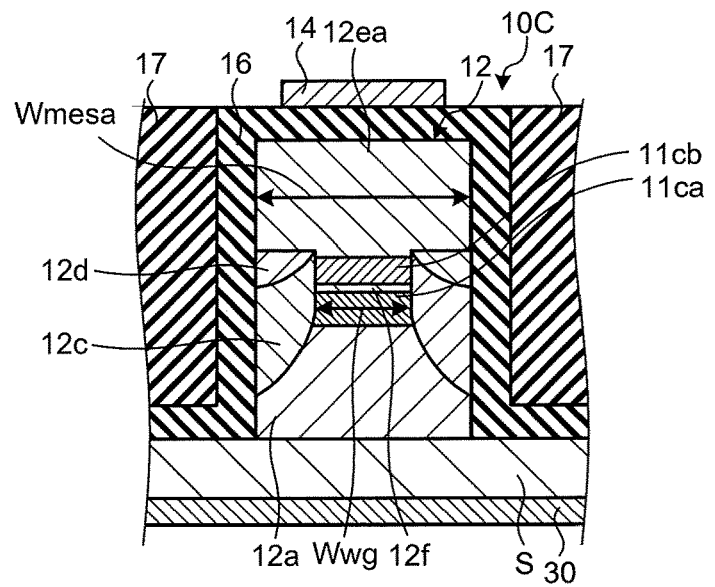
FIG. 3C is a cross-sectional view along C-C line illustrated in FIG. 2.

FIG. 3A is a cross-sectional view along A-A line illustrated in FIG. 2, FIG. 3B is a cross-sectional view along B-B line illustrated in FIG. 2, and FIG. 3C is a cross-sectional view along C-C line illustrated in FIG. 2. In FIG. 3A is illustrated the cross-section of the first optical waveguide structure portion 10A, in FIG. 3B is illustrated the cross-section of the second optical waveguide structure portion 10B, and in FIG. 3C is illustrated the cross-section of the third optical waveguide structure portion 10C.

Firstly, the explanation is given about the first optical waveguide structure portion 10A. As illustrated in FIG. 3A, the semiconductor mesa portion 12 of the first optical waveguide structure portion 10A includes a lower cladding layer 12a, which is made of the n-type InP, on an n-type InP substrate constituting the base S. On the lower cladding layer 12a, an active core layer 11a representing the optical waveguide 11 in the first optical waveguide structure portion 10A is layered. Moreover, on the active core layer 11a, a first upper cladding layer 12b made of the p-type InP is layered. The upper part of the lower cladding layer 12a along with the active core layer 11a and the first upper cladding layer 12b are subjected to etching to form a stripe mesa structure set to have the width (such as 2 µm) that is suitable in guiding, in the single mode, light in the band of 1.55 µm. The sides of the stripe mesa structure (i.e., the right-left direction of the paper sheet) has a buried structure including a current-blocking structure made of a p-type InP buried layer 12c and an n-type InP current-blocking layer 12d. Moreover, on the first upper cladding layer 12b and the buried structure, a p-type semiconductor layer 12e is layered. The p-type semiconductor layer 12e is configured with a second upper cladding layer 12ea made of the p-type InP, and a contact layer 12eb that is made of the p-type InGaAs layered on the second upper cladding layer 12ea and that constitutes the uppermost layer of the semiconductor mesa portion 12. The p-type semiconductor layer 12e is provided at least from directly above the first upper cladding layer 12b across the buried structures present on both sides of the stripe mesa structure. The first upper cladding layer 12b and the second upper cladding layer 12ea function in an integrated manner as the upper cladding layer with respect to the optical waveguide 11. In the semiconductor mesa portion 12, a SiN protective film 16 is formed to cover the semiconductor mesa portion 12. The p-side electrode 13 is made of AuZn, is formed on the contact layer 12eb, and makes an ohmic contact with the contact layer 12eb via an opening 16a formed on the SiN protective film 16. With such a configuration, current injection becomes possible from the n-side electrode 30 and the p-side electrode 13 to the active core layer 11a. Meanwhile, in the first optical waveguide structure portion 10A, the buried structure itself is a mesa structure.

The active core layer 11a includes a multiple quantum well structure configured with alternate layering of a plurality of well layers and a plurality of barrier layers, and includes an upper optical confinement layer and a lower optical confinement layer that sandwich the multiple quantum well structure in the vertical direction. The active core layer 11a emits light in response to current injection. The well layers and the barrier layers constituting the multiple quantum well structure of the active core layer 11a are made of GaInAsP with mutually different compositions. Moreover, in the embodiment, the emission wavelength band from the active core layer 11a is in the band of 1.55 µm. The lower optical confinement layer is made of the n-type GaInAsP. The upper optical confinement layer is made of the p-type GaInAsP. The bandgap wavelength of the lower and upper optical confinement layers is set to be shorter than the bandgap wavelength of the active core layer 11a.

The following explanation is given about the second optical waveguide structure portion 10B. As illustrated in FIG. 3B, the semiconductor mesa portion 12 of the second optical waveguide structure portion 10B has the structure formed by substituting an optical guide layer 11b made of GaInAsP for the active core layer 11a in the structure illustrated in FIG. 3A and by removing the contact layer 12eb. The optical guide layer 11b represents the optical waveguide 11 in the second optical waveguide structure portion 10B. The bandgap wavelength of the optical guide layer 11b is desirably shorter than the bandgap wavelength of the active core layer 11a and is equal to 1.2 µm, for example.

Meanwhile, as illustrated in FIG. 2, in the second optical waveguide structure portion 10B, the buried structure itself is a mesa structure having a tapering structure in which the mesa width continually goes on becoming narrower from the first optical waveguide structure portion 10A toward the third optical waveguide structure portion 10C. For example, in the linking portion with the first optical waveguide structure portion 10A, the second optical waveguide structure portion 10B has a mesa width Wm equal to 10 µm. Moreover, for example, the second optical waveguide structure portion 10B has a length L equal to 100 µm, or 120 µm, or 150 µm.

The following explanation is given about the third optical waveguide structure portion 10C that is the optical waveguide structure according to the embodiment. As illustrated in FIG. 3C, the semiconductor mesa portion 12 of the third optical waveguide structure portion 10C has a structure formed by substituting an optical guide layer 11ca, a spacer layer 12f, and a diffraction grating layer 11cb for the optical guide layer 11b and the first upper cladding layer 12b in the structure illustrated in FIG. 3B. Moreover, the micro heater 14 is disposed on the SiN protective film 16. The optical guide layer 11ca, the spacer layer 12f, and the diffraction grating layer 11cb represent the optical waveguide 11 in the third optical waveguide structure portion 10C.

The optical guide layer 11ca is made of GaInAsP. The bandgap wavelength of the optical guide layer 11ca is desirably shorter than the bandgap wavelength of the active core layer 11a and is equal to 1.2 µm, for example.

The diffraction grating layer 11cb includes sampled grating that is provided along the optical guide layer 11ca and provided near and directly above the optical guide layer 11ca across the spacer layer 12f made of the p-type InP; and is formed as a diffraction grating layer of the distributed Bragg reflector (DBR) type. That is, the diffraction grating layer 11cb is positioned on the side of the second upper cladding layer 12ea with respect to the optical guide layer 11ca. The diffraction grating layer 11cb has a configuration in which sampled grating is formed in the P-type GaInAsP layer along the z-direction, and the slits in the diffraction grating are buried with InP. In the diffraction grating layer 11cb, the grating spacing of the diffraction grating is regular and is sampled, and thus produces a substantially cyclic reflex response with respect to the wavelength. The bandgap wavelength of the p-type GaInAsP layer of the diffraction grating layer 11cb is desirably shorter than the bandgap wavelength of the active core layer 11a and is equal to 1.2 µm, for example.

Meanwhile, in the third optical waveguide structure portion 10C, the buried structure itself is a mesa structure that at least includes the lower cladding layer 12a, the optical guide layer 11ca, and the second upper cladding layer 12ea. Moreover, as described above, the micro heater 14 produces heat in response to receiving the supply of electrical current via the electrode pads 15, and heats the diffraction grating layer 11cb. If the amount of the supplied electrical current is altered, the diffraction grating layer 11cb undergoes a change in temperature and a change in refractive index.

Returning to the explanation with reference to FIG. 1, the second optical waveguide portion 20 includes a bifurcating portion 21, two arm portions 22 and 23, a ring-shaped waveguide 24, and a micro heater 25 made of titanium (Ti).

The bifurcating portion 21 is configured with a 1×2 branching waveguide including a 1×2 multimode interference (MMI) waveguide 21a; and has the 2-port side connected to the two arm portions 22 and 23, and has the 1-port side connected to the first optical waveguide portion 10. Because of the bifurcating portion 21, one end of each of the two arm portions 22 and 23 get integrated and are optically coupled with the diffraction grating layer 11cb.

The arm portions 22 and 23 extend in the z-direction and are disposed to sandwich the ring-shaped waveguide 24. Thus, the arm portions 22 and 23 are positioned adjacent to the ring-shaped waveguide 24 and are optically coupled with the ring-shaped waveguide 24 by a coupling coefficient κ. The coupling coefficient κ has the value equal to 0.2, for example. The arm portions 22 and 23 along with the ring-shaped waveguide 24 constitute a ring resonator filter RF1. Moreover, the ring resonator filter RF1, the bifurcating portion 21, and a phase adjusting unit 27 (described below) constitute a reflective mirror M1. The micro heater 25 is a ring-shaped heater that is disposed on a SiN protective film formed to cover the ring-shaped waveguide 24. The micro heater 25 produces heat in response to receiving the supply of electrical current, and heats the ring-shaped waveguide 24. If the amount of the supplied electrical current is altered, the ring-shaped waveguide 24 undergoes a change in temperature and a change in refractive index.

Each of the bifurcating portion 21, the arm portions 22 and 23, and the ring-shaped waveguide 24 has a high-mesa waveguide structure in which an optical guide layer 20a made of GaInAsP is sandwiched by a lower cladding layer made of the n-type InP and an upper cladding layer made of the p-type InP.

Moreover, on some part of the SiN protective film of the arm portion 23, a micro heater 26 is disposed. Of the arm portion 23, the area below the micro heater 26 functions as the phase adjusting unit 27 for varying the phase of the light. The micro heater 26 produces heat in response to receiving the supply of electrical current, and heats the phase adjusting unit 27. If the amount of the supplied electrical current is altered, the phase adjusting unit 27 undergoes a change in temperature and a change in refractive index.

The first optical waveguide portion 10 and the second optical waveguide portion 20 constitute an optical resonator C1, which is configured with the diffraction grating layer 11cb and the reflective mirror M1 that represent a pair of optically-connected wavelength selecting elements. The reflective mirror M1 also includes the phase adjusting unit 27 besides including the bifurcating portion 21, the arm portion 22, the arm portion 23 (including the phase adjusting unit 27), and the ring-shaped waveguide 24. Thus, the phase adjusting unit 27 is disposed inside the reflective mirror M1.

In the wavelength-tunable laser device 100, the diffraction grating layer 11cb generates a first comb-shaped reflectance spectrum having a substantially cyclic reflectance property at substantially predetermined wavelength intervals. The ring resonator filter RF1 generates a second comb-shaped reflectance spectrum having a substantially cyclic reflectance property at substantially predetermined wavelength intervals. The second comb-shaped reflectance spectrum has a narrower peak of the full width at half maximum than the peak of the full width at half maximum of the first comb-shaped reflectance spectrum, and has a substantially cyclic reflectance property at different wavelength intervals than the wavelength intervals of the first comb-shaped reflectance spectrum. However, if the wavelength dispersion of the refractive index is taken into account, it is necessary to give attention to the fact that the spectral component does not have precisely equal wavelength intervals.

As an example of the property of each comb-shaped reflectance spectrum, the inter-peak wavelength interval (free spectral range: FSR) of the first comb-shaped reflectance spectrum is equal to 373 GHz if expressed in frequency of light. The inter-peak wavelength interval (FSR) of the second comb-shaped reflectance spectrum is equal to 400 GHz if expressed in frequency of light.

In the wavelength-tunable laser device 100, in order to achieve laser emission, the configuration is such that one of the peaks of the first comb-shaped reflectance spectrum and one of the peaks of the second comb-shaped reflectance spectrum can be superposed on the wavelength axis. Such superposition can be achieved by using at least either the micro heater 14 or the micro heater 25 and by performing at least one of the following: the diffraction grating layer 11cb is heated using the micro heater 14 so as to vary the refractive index of the diffraction grating layer 11cb due to the thermo-optic effect, and the first comb-shaped reflectance spectrum is varied by moving it entirely on the wavelength axis; and the ring-shaped waveguide 24 is heated using the micro heater 25 so as to vary the refractive index of the ring-shaped waveguide 24, and the second comb-shaped reflectance spectrum is varied by moving it entirely on the wavelength axis.

In the wavelength-tunable laser device 100, a resonator mode attributed to the optical resonator C1 is present. In the wavelength-tunable laser device 100, the cavity length of the optical resonator C1 is set in such a way that the interval for the resonator mode (the longitudinal mode interval) becomes equal to or smaller than 25 GHz. The wavelength of the resonator mode of the optical resonator C1 can be fine-tuned by heating the phase adjusting unit 27 using the micro heater 26, varying the refractive index of the phase adjusting unit 27, and moving the entire wavelength of the resonator mode on the wavelength axis. That is, the phase adjusting unit 27 represents the portion for actively controlling the optical path length of the optical resonator C1.

The wavelength-tunable laser device 100 is configured in such a way that, when electrical current is injected from the n-side electrode 30 and the p-side electrode 13 to the active core layer 11a thereby making the active core layer 11a emit light, laser emission occurs at the wavelength, such as 1550 nm, that either matches with the peak of the spectral component of the first comb-shaped reflectance spectrum, or matches with the peak of the spectral component of the second comb-shaped reflectance spectrum matches, or matches with the resonator mode of the optical resonator C1, thereby resulting in the output of a laser light L1.

Moreover, in the wavelength-tunable laser device 100, the laser emission wavelength can be varied by making use of the Vernier effect. For example, when the diffraction grating layer 11cb is heated using the micro heater 14, the refractive index of the diffraction grating layer 11cb increases due to the thermo-optical effect, and the reflectance spectrum of the diffraction grating layer 11cb (i.e., the first comb-shaped reflectance spectrum) entirely shifts toward the long-wave side. As a result, the superimposition occurring in the vicinity of 1550 nm between the peak of the first comb-shaped reflectance spectrum and the peak of the reflectance spectrum of the ring resonator filter RF1 (i.e., the second comb-shaped reflectance spectrum) gets released, and the peak of the first comb-shaped reflectance spectrum gets superposed with some other peak (for example, in the vicinity of 1556 nm) of the second comb-shaped reflectance spectrum. Besides, the phase adjusting unit 27 is tuned so as to fine-tune the resonator modes, and one of the resonator modes is superposed with the two comb-shaped reflectance spectrums; so that laser emission can be achieved in the vicinity of 1556 nm.

As described earlier, in the wavelength-tunable laser device 100, in order to achieve laser emission and to vary the laser emission wavelength, the diffraction grating layer 11cb is heated using the micro heater 14. In order to enhance the heating efficiency of the micro heater 14, the structure of the third optical waveguide structure portion 10C is ensured to satisfy a conditional expression given below.

That is, the following equation is satisfied:

$$W_{wg} \leq W_{mesa} \leq 3 \times W_{wg}$$

wherein, $W_{mesa}$ represents a mesa width of the mesa structure in the third optical waveguide structure portion 10C, and $W_{wg}$ represents a width of the optical guide layer 11ca, as illustrated in FIG. 3C.

Consequently, since the optical guide layer 11ca, which is made of a material (GaInAsP) having lower thermal conductivity than the material (InP) of the second upper cladding layer 12ea, has a greater proportion in the width direction of the mesa structure; it becomes possible to enhance the heating efficiency of the micro heater 14.

Given below is specific explanation with reference to simulation-based calculation examples. As a calculation example 1, an optical waveguide structure of a mesa structure; which is formed on a substrate made of InP and in which an optical guide layer made of GaInAsP is laid in between an upper cladding portion and a lower cladding portion made of InP, was treated as the calculation model. Then, with respect to that calculation model, the effective refractive index of the optical guide layer was calculated along with calculating the heat resistance at the time when heat was applied from the top surface of the cladding layer. In this calculation model, the width of the optical guide layer is kept constant, and the mesa width of the mesa structure is set to a different value for each calculation model. Moreover, in the calculation model, an optical waveguide structure in which the mesa width is equal to the width of the optical guide layer represents an optical waveguide structure of the high-mesa structure; and an optical waveguide structure in which the mesa width is greater than the width of the optical guide layer represents an optical waveguide structure of the buried structure. In a buried structure, the layers formed on both lateral faces of the optical guide layer are called buried layers.

The specific calculation parameters that were used in the calculation are as follows. Firstly, the optical guide layer has the thickness of 0.3 μm and has the width ($W_{wg}$) of 2 μm. Moreover, the optical guide layer has such a composition that the bandgap wavelength becomes equal to 1.2 μm; has the refractive index of 3.3542 at the wavelength of 1.55 μm; and is made of GaInAsP having the thermal conductivity of 5 W/Km. The upper cladding layer, the lower cladding layer, and the buried layers all have the refractive index of 3.165 at the wavelength of 1.55 μm; and are made of InP having the thermal conductivity of 68 W/Km. The upper cladding layer has the thickness of 1.5 μm, and the lower cladding layer has the thickness of 1.0 μm.

As a calculation example 2, an optical waveguide structure that is configured by replacing the optical guide layer in the optical waveguide structure of the calculation model in the calculation example 1 by a layer made of InP same as the cladding layer was treated as the calculation model, and the heat resistance was calculated when heat was applied from the top surface of the cladding layer.

Figure 4:
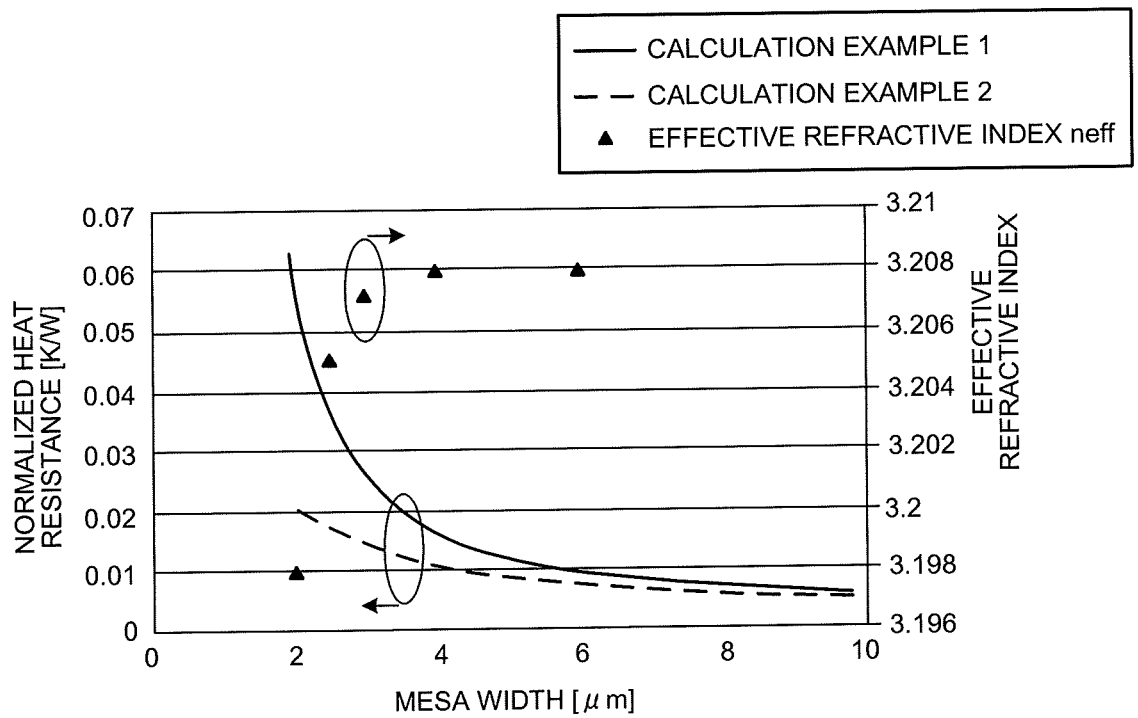
FIG. 4 is a diagram illustrating the normalized heat resistance in calculation examples 1 and 2 and illustrating the effective refractive index in the calculation example 1.

FIG. 4 is a diagram illustrating the normalized heat resistance in the calculation examples 1 and 2 and illustrating the effective refractive index in the calculation example 1. The normalized heat resistance represents the amount indicating the rise in temperature in kelvin degrees of the top surface of the upper cladding layer when the heat quantity of 1 W is applied from the top surface of the upper cladding layer. Herein, the effective refractive index is the value at the wavelength of 1.55 μm.

As illustrated in FIG. 4, in the calculation example 1, if the mesa width is kept on reducing from about 10 μm, then the normalized heat resistance increases at a slow rate. However, when the mesa width becomes equal to or smaller than 6 μm, the normalized heat resistance increases in an exponential manner. That is, within the range in which "$W_{wg} \leq W_{mesa} \leq 3 \times W_{wg}$" is satisfied, the heat resistance becomes noticeably high, thereby enabling achieving enhancement in the heating efficiency of a heater. Moreover, within the range in which "$W_{wg} \leq W_{mesa} \leq 2 \times W_{wg}$" is satisfied, the heat resistance becomes more noticeably high, thereby enabling achieving further enhancement in the heating efficiency of a heater. Hence, it is a desirable condition. In the calculation example 2 too, the normalized heat resistance exponentially increases when the mesa width becomes equal to or smaller than 6 μm. However, in the calculation example 1 in which the optical guide layer having low thermal conductivity is present, the increase in the normalized heat resistance is more noticeable.

In the calculation example 2, the increase in the heat resistance is the effect of an increase in the heat gradient occurring due to the narrowing of the width (mesa width) of the flow channel thorough which the applied heat flows; and it is believed that the mesa width is inversely proportional to the heat resistance. In contrast, in the calculation example 1, it was confirmed that the heat resistance increases by a large margin that is greater than the prediction based on the result of the calculation example 2.

Meanwhile, in the calculation example 1, the optical guide layer has the composition in which the bandgap wavelength is equal to 1.2 μm, and is made of GaInAsP having the thermal conductivity of 5 W/Km. Thus, the thermal conductivity is substantially lower than InP having the thermal conductivity of 68 W/Km. However, regarding GaInAsP, if the composition is transparent with respect to the light having the wavelength between 1.3 μm to 1.6 μm, then the thermal conductivity is substantially lower than InP. Thus, even with respect to GaInAsP having the composition that is transparent with respect to the light having the wavelength between 1.3 μm to 1.6 μm and that has a higher refractive index than InP, it is believed that the relationship between the mesa width and the normalized heat resistance is identical to the result illustrated in FIG. 4.

Moreover, as illustrated in FIG. 4, the mesa width is equal to 6 μm. That is, when $W_{mesa}=3\times W_{wg}$ is satisfied, the effective refractive index of the optical guide layer is equal to 3.208. However, when the mesa width falls below 4 μm, the effective refractive index falls in an exponential manner. It implies that, when $W_{mesa}\leq 2\times W_{wg}$ is satisfied, as compared to the case in which the mesa width is equal to $W_{mesa}=3\times W_{wg}$ thereby being sufficiently greater than $W_{mesa}$, the propagation state of the light in the optical guide layer is affected by the narrowness of the mesa width.

Figure 5:
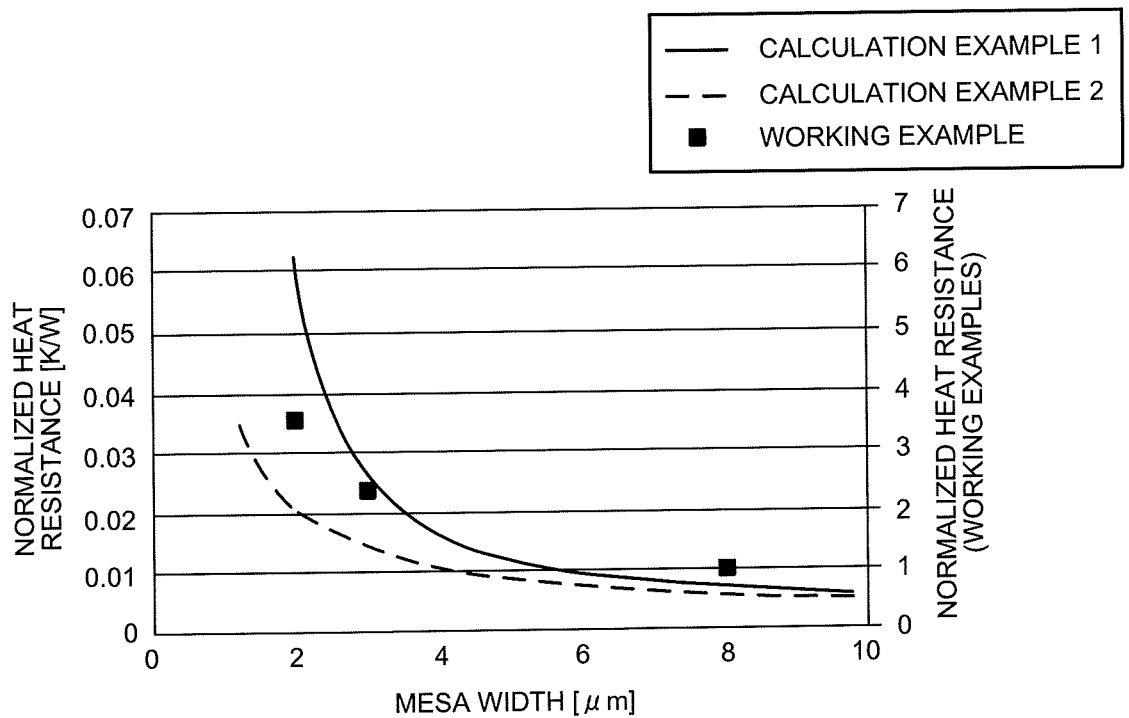
FIG. 5 is a diagram illustrating the normalized heat resistance in the calculation examples 1 and 2 and illustrating the normalized heat resistance in working examples 1 to 3.

Subsequently, as working examples 1, 2, and 3; an optical waveguide structure was manufactured according to the calculation model of the calculation example 1, and the heat resistance was measured. In the working examples 1, 2, and 3; the mesa width was set to 2 μm, 3 μm, and 8 μm, respectively. FIG. 5 is a diagram illustrating the normalized heat resistance in the calculation examples 1 and 2 and illustrating the normalized heat resistance in the working examples 1 to 3. The normalized heat resistance in the working examples 1 to 3 (the right vertical axis) as illustrated in FIG. 5 represents the values normalized at the normalized heat resistance [K/W] in the working example 3 in which the mesa width is equal to 8 μm; and is non-dimensional in nature. As illustrated in FIG. 5, the mesa-width dependency of the normalized heat resistance in the working examples 1 to 3 indicates the same tendency as the mesa-width dependency of the normalized heat resistance in the calculation example 1; and thus the validness of the calculation models was confirmed.

Figure 6A:
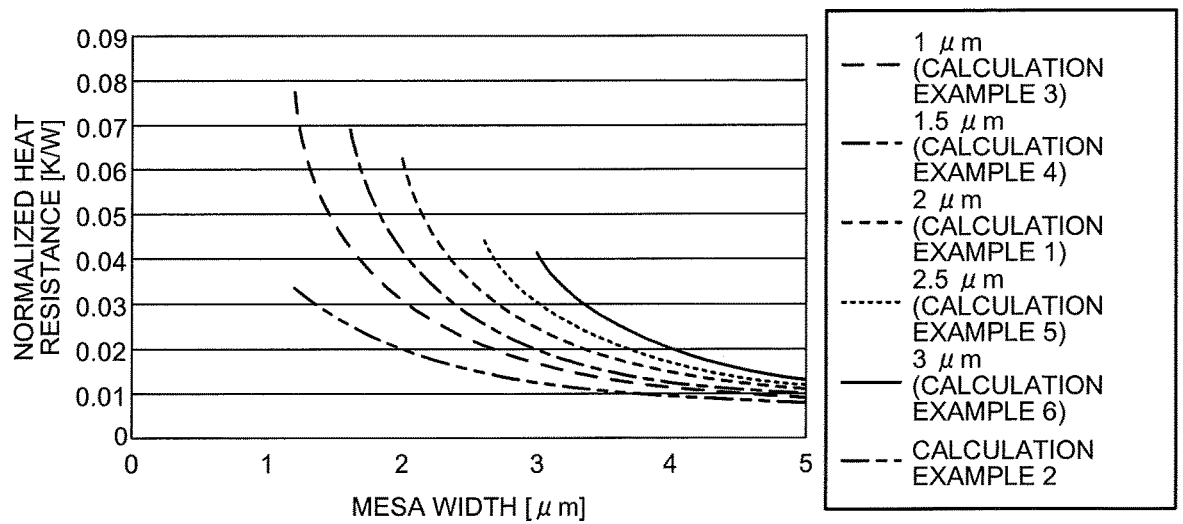
FIG. 6A is a diagram illustrating the normalized heat resistance in calculation examples 1 to 6.
Figure 6B:
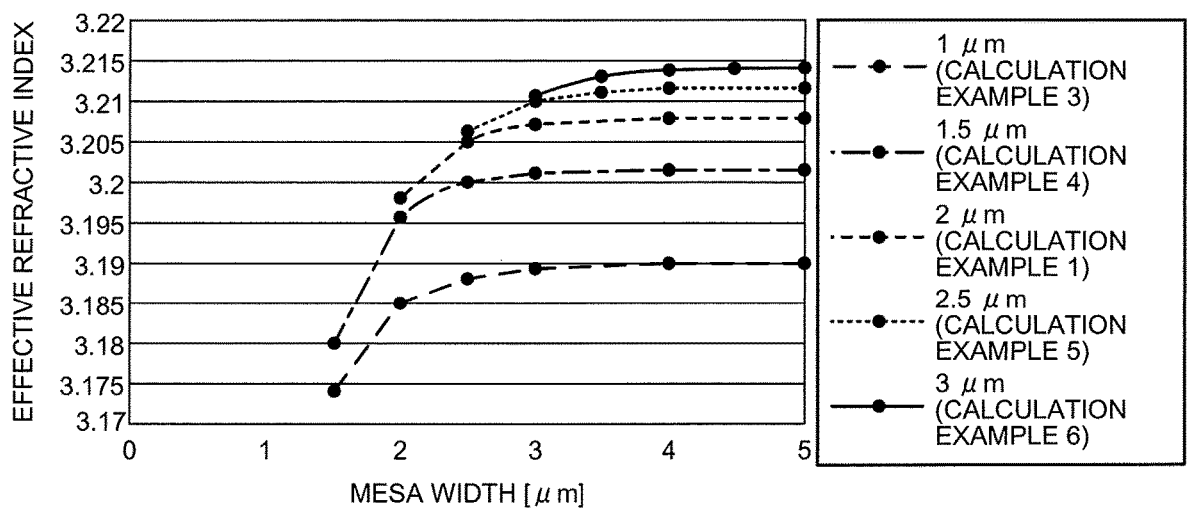
FIG. 6B is a diagram illustrating the effective refractive index in the calculation example 1 and the calculation examples 3 to 6.

FIG. 6A is a diagram illustrating the normalized heat resistance in the calculation examples 1 and 2 and illustrating the normalized heat resistance in the cases in which the width of the optical guide layer in the calculation model of the calculation example 1 is varied to 1 μm, (a calculation example 3), 1.5 μm (a calculation example 4), 2.5 μm (a calculation example 5), and 3 μm (a calculation example 6). FIG. 6B is a diagram illustrating the effective refractive index in the calculation example 1 and the calculation examples 3 to 6. The calculation example 1 and the calculation examples 3 to 6 are examples in which the calculation was performed within the range in which at least 1 $\mu m \leq W_{wg} \leq 3$ μm and 2 $\mu m \leq W_{mesa} \leq 4$ μm are satisfied. In Table 1 is illustrated the effective refractive index and the normalized heat resistance extracted from the calculation examples 1, 4 and 5 for the values of the width $W_{wg}$ and the mesa width $W_{mesa}$ within the range in which 1 $\mu m \leq W_{wg} \leq 3$ μm and 2 $\mu m \leq W_{mesa} \leq 4$ μm are satisfied.

TABLE 1

| $W_{wg}$ [μm] | $W_{mesa}$ [μm] | Effective refractive index | Standardized heat resistance [K/W] |
|---|---|---|---|
| 2.0 | 4.0 | 3.208 | 0.015 |
| 2.0 | 3.0 | 3.207 | 0.025 |
| 2.0 | 2.5 | 3.205 | 0.035 |
| 2.0 | 2.0 | 3.198 | 0.063 |
| 2.0 | 5.0 | 3.208 | 0.011 |
| 1.5 | 3.0 | 3.201 | 0.021 |
| 2.5 | 4.0 | 3.212 | 0.018 |

As illustrated in FIG. 6A, regardless of the value of the width $W_{wg}$, as long as $W_{mesa}\leq 4$ is satisfied, the heat resistance becomes high and the heating efficiency of the heater can be enhanced. Moreover, as illustrated in FIG. 6B, when the mesa width $W_{mesa}$ is greater than 4 μm, the effective refractive index is substantially constant regardless of the value of the width $W_{mesa}$. However, when the mesa width $W_{mesa}$ is equal to or smaller than 4 μm, the effective refractive index decreases in proportion to the mesa width $W_{mesa}$. It implies that, as described earlier, the propagation state of the light in the optical guide layer is affected by the narrowness of the mesa width.

Herein, it is assumed that $W_{wg}\leq W_{mesa}\leq 2\times W_{wg}$ is satisfied in the third optical waveguide structure portion 10C. In that case, the state of the third optical waveguide structure portion 10C is such that the propagation state of the light in the optical guide layer is affected by the narrowness of the mesa width. On the other hand, in the first optical waveguide structure portion 10A, there is sufficiently large mesa width with respect to the width of the active core layer 11a representing the optical guide layer, and the mesa width is equal to or greater than 250 μm, for example. Thus, in the first optical waveguide structure portion 10A, the effective refractive index is substantially constant regardless of the mesa width. Hence, in the first optical waveguide structure portion 10A, regarding the light having a predetermined wavelength (such as 1.55 μm) and propagating through the active core layer 11a, the mode field radius or the propagation constant of that light is different than the mode field radius or the propagation constant of the light having the same wavelength and propagating through the optical guide layer 11ca of the third optical waveguide structure portion 10C. When the waveguides having different mode field radii or different propagation constants of the light are directly connected to each other, the mode field radii or the propagation constants undergo changes in a discontinuous manner, thereby causing a substantial optical loss or s substantial optical reflection.

In that regard, in the wavelength-tunable laser device 100, the active core layer 11a and the optical guide layer 11ca are connected via the second optical waveguide structure portion 10B that functions as a mode field conversion structure. As described earlier, the second optical waveguide structure portion 10B has a tapering shape with the mesa width of the buried structure continually becoming narrower from the first optical waveguide structure portion 10A toward the third optical waveguide structure portion 10C (see FIG. 2). As a result, the mode field radius or the propagation constant of the light propagating through the optical guide layer 11b in the second optical waveguide structure portion 10B also undergoes changes in a continuous manner from the value in the active core layer 11a to the value in the optical guide layer 11ca. That enables holding down the optical loss or the optical reflection. More desirably, if the buried structure of the second optical waveguide structure portion 10B has such a mesa width that, in the first optical waveguide structure portion 10A, the mode field radius or the propagation constant in the optical guide layer 11b is substantially equal to the mode field radius or the propagation constant in the active core layer 11a, and has such a mesa width that is equal to the mesa width in the third optical waveguide structure portion 10C; then the optical loss or the optical reflection can be held down in a more effective manner.

As explained above, in the third optical waveguide structure portion 10C of the wavelength-tunable laser device 100, it becomes possible to enhance the heating efficiency for heating the diffraction grating layer 11cb using the micro heater 14.

Meanwhile, the wavelength-tunable laser device 100 can be manufactured by following the process described below. Firstly, on an n-type InP substrate constituting the base S, the metal organic chemical vapor deposition (MOCVD) technique is implemented to sequentially deposit the lower cladding layer 12a and the lower cladding layer in the second optical waveguide portion 20; the active core layer 11a; and the first upper cladding layer 12b.

Subsequently, after depositing a SiN film on the entire surface, patterning is performed on the SiN film. Then, etching is performed with the SiN film serving as the mask and, other than the area in which the first optical waveguide structure portion 10A is to be formed, the active core layer 11a and the first upper cladding layer 12b are removed from the entire remaining area. Moreover, the mask of the SiN film is used as it is as a selective growth mask, and the MOCVD technique is implemented to sequentially deposit the optical guide layers 11b and 11ca and the optical guide layer 20a in the second optical waveguide portion 20; the spacer layer 12f; the p-type InGaAsP layer serving as the diffraction grating layer 11cb; and some part of the second upper cladding layer 12ea.

Subsequently, after the mask of the SiN film is removed and after a SiN film is deposited on the entire surface, patterning of diffraction grating is performed on the SiN film of the area in which the diffraction grating layer 11cb is to be formed. Then, etching is performed with the SiN film serving as the mask; grating grooves are formed that would serve as the diffraction grating in the p-type InGaAsP layer; and the p-type InGaAsP layer is removed from all positions other than the position of forming the diffraction grating layer 11cb.

Subsequently, after the mask of the SiN film is removed, the p-type InP layer is regrown on the entire surface. Then, a SiN film is newly deposited, and patterning is performed to form a pattern corresponding to the optical waveguide 11 in the first optical waveguide portion 10 and a pattern corresponding to the optical guide layer in the second optical waveguide portion 20. Subsequently, etching is performed with the SiN film serving as the mask; a stripe mesa structure is formed in the first optical waveguide portion 10 and the second optical waveguide portion 20; and the lower cladding layer 12a is exposed. At that time, etching is performed in the shape of a broad area including the areas corresponding to the bifurcating portion 21, the arm portions 22 and 23, and the ring-shaped waveguide 24.

Then, the SiN film mask used in the previous process is used as the selective growth mask, and a buried structure is formed by sequentially depositing the exposed lower cladding layer 12a, the p-type InP buried layer 12c, and the n-type InP current-blocking layer 12d according to the MOCVD technique. Subsequently, after the mask of the SiN film is removed, the MOCVD technique is implemented to sequentially deposit, on the entire surface, the second upper cladding layer 12ea and the p-type InP layer representing the remaining part of the upper cladding layer in the second optical waveguide portion 20; and the contact layer 12eb. Then, the contact layer 12eb is removed from the areas other than the area in which the first optical waveguide structure portion 10A is to be formed. Subsequently, a SiN film is deposited on the entire surface; and patterning is performed for the shapes of the first optical waveguide structure portion 10A, the second optical waveguide structure portion 10B, and the third optical waveguide structure portion 10C, as well as patterning is performed for the waveguides corresponding to the bifurcating portion 21, the arm portions 22 and 23, and the ring-shaped waveguide 24. Then, etching is performed with the SiN film serving as the mask; and the mesa structure of the first optical waveguide structure portion 10A, the second optical waveguide structure portion 10B, and the third optical waveguide structure portion 10C is formed, the supporting mesa portions 10D are formed, and the high-mesa waveguide structure in the second optical waveguide portion 20 is formed. This etching is performed, for example, over the depth reaching the base S. That is followed by the formation of the SiN protective film 16, the insulating member 17, the n-side electrode 30, the micro heaters 14 and 26, the electrode pads 15, and the wiring pattern. Lastly, the substrate is subjected to bar-shaped cleaving in which a plurality of wavelength-tunable laser devices 100 is arranged; a reflection prevention film is coated on the lateral end faces of the third optical waveguide structure portion 10C and the end faces of the arm portions 22 and 23; and device isolation is performed for each wavelength-tunable laser device 100, thereby resulting in the completion of the manufacturing of the wavelength-tunable laser devices 100.

Modification Example

Figure 7:
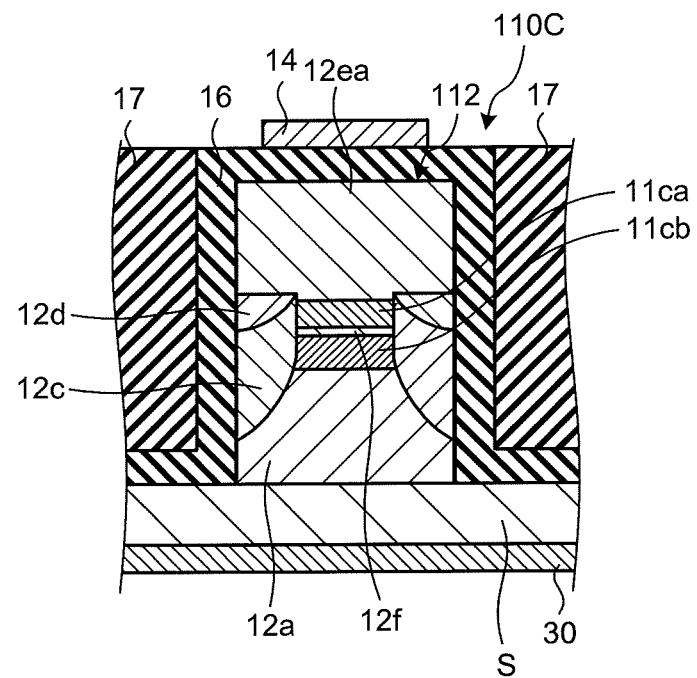
FIG. 7 is a diagram illustrating a first modification example of the optical waveguide structure.

The optical waveguide structure according to the present disclosure is not limited to the embodiment described above, and can be modified into various other forms. FIG. 7 is a diagram illustrating a first modification example of the optical waveguide structure. An optical-waveguide structure 110C representing the first modification example of the optical waveguide structure according to the embodiment includes a semiconductor mesa portion 112 in which the position of the diffraction grating layer 11cb and the position of the optical guide layer 11ca in the semiconductor mesa portion 12 of the third optical waveguide structure portion 10C are interchanged. That is, in the optical waveguide structure 110C, the diffraction grating layer 11cb is positioned on the side of the lower cladding layer 12a with respect to the optical guide layer 11ca. In the optical waveguide structure 110C too, regarding the mesa width $W_{mesa}$ of the mesa structure and regarding the width $W_{wg}$ of the optical guide layer 11ca, $W_{wg} \leq W_{mesa} \leq 3 \times W_{wg}$ is satisfied. Moreover, the mesa width $W_{mesa}$ is equal to or smaller than 4 μm. As a result, even if the structure is such that the diffraction grating layer 11cb is positioned on the opposite side of the micro heater 14 with respect to the optical guide layer 11ca, it becomes possible to enhance the heating efficiency for heating the diffraction grating layer 11cb using the micro heater 14.

Figure 8:
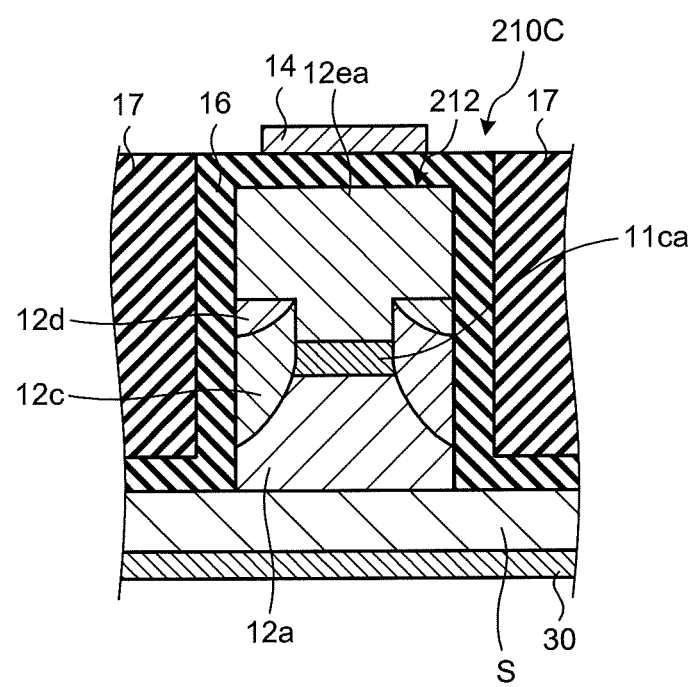
FIG. 8 is a diagram illustrating a second modification example of the optical waveguide structure.

FIG. 8 is a diagram illustrating a second modification example of the optical waveguide structure. An optical waveguide structure 210C representing the second modification example has a structure in which a semiconductor mesa portion 212 is substituted for the semiconductor mesa portion 12 of the third optical waveguide structure portion 10C. The semiconductor mesa portion 212 is configured by removing the diffraction grating layer 11cb and the spacer layer 12f from the semiconductor mesa portion 12. In the semiconductor mesa portion 212, a second upper cladding layer 212ea is formed up to the area present directly above the optical guide layer 11ca. The optical waveguide structure 210C heats the optical guide layer 11ca using the micro heater 14, varies the refractive index of the optical guide layer 11ca, and fulfils predetermined functions of phase adjustment. In the optical waveguide structure 210C too, regarding the mesa width $W_{mesa}$ of the mesa structure and regarding the width $W_{wg}$ of the optical guide layer 11ca, $W_{wg} \leq W_{mesa} \leq 3 \times W_{wg}$ is satisfied. As a result, it becomes possible to enhance the heating efficiency for heating the optical guide layer 11ca using the micro heater 14. Meanwhile, if the optical guide layer 11ca has the function of diffraction grating, then the reflection wavelength can be varied as a result of heating. Moreover, if the optical waveguide structure 210C is implemented in an optical waveguide in an optical resonator of a Fabry-Perot semiconductor laser device and if the optical guide layer 11ca has the function of the active core layer, the laser emission wavelength can be varied as a result of heating. In both cases, it becomes possible to enhance the heating efficiency for heating the optical guide layer 11ca using the micro heater 14.

Figure 9:
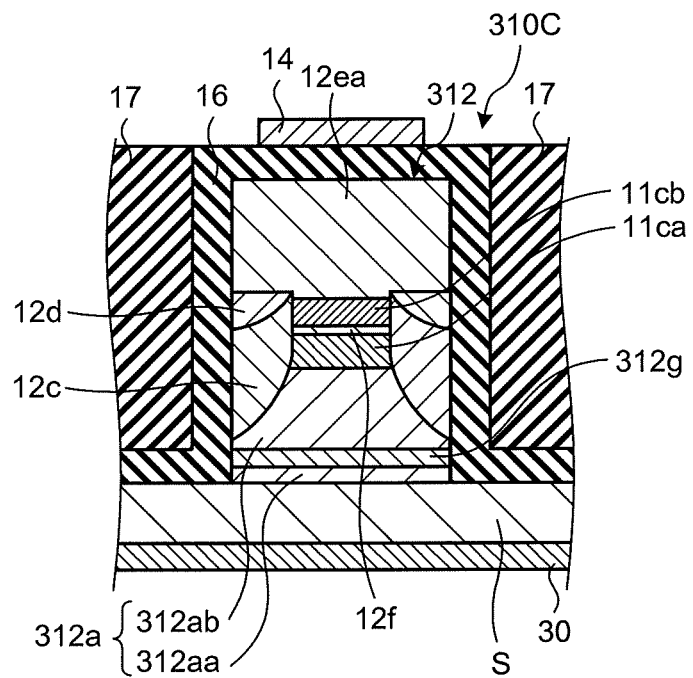
FIG. 9 is a diagram illustrating a third modification example of the optical waveguide structure.

FIG. 9 is a diagram illustrating a third modification example of the optical waveguide structure. An optical waveguide structure 310C representing the third modification example has a structure in which a semiconductor mesa portion 312 is substituted for the semiconductor mesa portion 12 of the third optical waveguide structure portion 10C. The semiconductor mesa portion 312 has a structure in which a lower cladding layer 312a and a low thermal conductivity layer 312g are substituted for the lower cladding layer 12a of the semiconductor mesa portion 12. The lower cladding layer 312a is made of lower cladding layers 312aa and 312ab. The low thermal conductivity layer 312g is sandwiched between the lower cladding layers 312aa and 312ab, and is positioned on the side of the base S with respect to the optical guide layer 11ca. The low thermal conductivity layer 312g is made of an n-type material (such as AlInAsP or oxidized GaAlInAsP) that has lower thermal conductivity than the InP constituting the lower cladding layer 312a; and constitutes a low thermal conductivity area.

Since the optical waveguide structure 310C includes the low thermal conductivity layer 312g, the heat applied from the micro-heater 14 is prevented from diffusing toward the base S. Thus, in combination with the effect attributed to the fact that $W_{wg} \leq W_{mesa} \leq 3 \times W_{wg}$ is satisfied, the heating efficiency for heating the optical guide layer 11ca using the micro heater 14 can be further enhanced.

Meanwhile, when the low thermal conductivity layer 312g is configured using oxidized GaAlInAsP, the configuration is done as follows. Firstly, in the process of forming the semiconductor mesa portion 312, a GaAlInAsP layer is deposited at the position at which the low thermal conductivity layer 312g should be formed. Then, after a mesa structure is formed, annealing is performed under a water-vapor atmosphere with respect to the GaAlInAsP layer having exposed lateral faces, and the GaAlInAsP layer is subjected to thermal oxidation from the exposed lateral faces.

Figure 10:
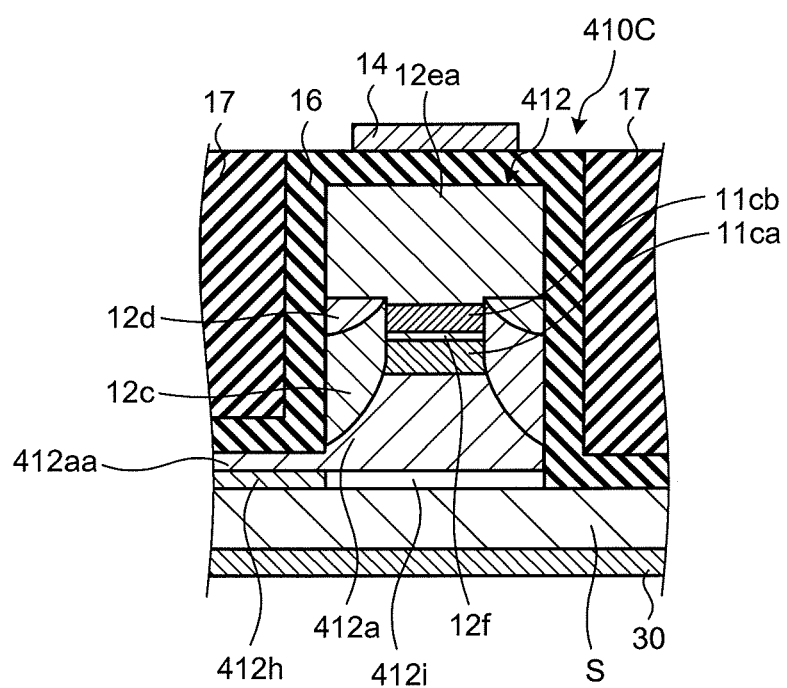
FIG. 10 is a diagram illustrating a fourth modification example of the optical waveguide structure.

FIG. 10 is a diagram illustrating a fourth modification example of the optical waveguide structure. An optical waveguide structure 410C representing the fourth modification example has a structure in which a semiconductor mesa portion 412 is substituted for the semiconductor mesa portion 12 of the third optical waveguide structure portion 10C. The semiconductor mesa portion 412 has a structure in which a lower cladding layer 412a, which includes a supporting area 412aa extending in one side of the lateral direction with respect to the mesa structure, is substituted for the lower cladding layer 12a of the semiconductor mesa portion 12; and in which a supporting layer 412h is provided in between the supporting area 412aa of the lower cladding layer 412a and the base S. The supporting layer 412h is made of n-type AlInAs, for example. With such a configuration, a hollow area 412i representing a low thermal conductivity area gets formed in between the portion of the mesa structure of the lower cladding layer 412a and the base. The hollow area 412i is filled with a gaseous matter such as air.

Since the optical waveguide structure 410C includes the hollow area 412i, the heat applied from the micro heater 14 is prevented from diffusing toward the base S. Thus, in combination with the effect attributed to the fact that $W_{wg} \leq W_{mesa} \leq 3 \times W_{wg}$ is satisfied, the heating efficiency for heating the optical guide layer 11ca using the micro heater 14 can be further enhanced.

Given below is the explanation of a manufacturing method for manufacturing the optical waveguide structure 410C. Firstly, on an n-type InP substrate, an AlInAs layer representing the supporting layer 412h is deposited, and then the layers upward of the lower cladding layer 412a are deposited. Then, at the time of forming the mesa structure, firstly, etching is performed in such a way that the supporting area 412aa remains intact in the lower cladding layer 412a, and that is followed by etching in such a way that some part of the AlInAs layer is exposed on the lateral face on the opposite side of the supporting area 412aa. Subsequently, for example, using an etching solution of the hydrofluoric acid type, the AlInAs layer in the mesa structure is selectively etch-removed, and the supporting layer 412h and the hollow area 412i are formed.

Meanwhile, in the embodiment and the modification examples described above, the diffraction grating is assumed to be sampled grating. However, the type of diffraction grating is not limited to that example, and alternatively the diffraction grating can be superstructure grating or superimposed grating.

According to the present disclosure, it becomes possible to implement an optical waveguide structure in which the heating efficiency of a heater is enhanced.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:
1. An optical waveguide structure comprising:
a lower cladding layer positioned on a substrate;

an optical guide layer positioned on the lower cladding layer such that the optical waveguide structure has no air gap below the optical guide layer;
an upper cladding layer positioned on the optical guide layer; and
a heater positioned on the upper cladding layer, wherein
the lower cladding layer, the optical guide layer, and the upper cladding layer constitute a mesa structure,
the optical guide layer has a lower thermal conductivity than the upper cladding layer,
a protective film is formed to cover the mesa structure, the protective film being made of a different material from a semiconductor of the mesa structure, and a side of the protective film is filled with an insulating member such that an equation "$W_{wg} \leq W_{mesa} \leq 3 \times W_{wg}$" is satisfied, where
$W_{mesa}$ represents a mesa width of the mesa structure, and
$W_{wg}$ represents a width of the optical guide layer,
the optical guide layer occupies one-third or more of the mesa width in a width direction of the mesa structure, and
the lower cladding layer, the optical guide layer and the upper cladding layer are configured such that a degree of increase in a heat resistance when $W_{wg}$ is 2 μm and $W_{mesa}$ is 6 μm or less is greater than when $W_{wg}$ is 2 μm and $W_{mesa}$ is more than 6 μm and 10 μm or less, the heat resistance indicating an extent to which a temperature of a top surface of the upper cladding layer rises when heat is applied from the top surface of the upper cladding layer.

2. The optical waveguide structure according to claim 1, wherein an equation "$W_{wg} \leq W_{mesa} \leq 2 \times W_{wg}$" is satisfied.

3. The optical waveguide structure according to claim 1, wherein an equation "$W_{wg} \leq W_{mesa} \leq 4$ μm" is satisfied.

4. The optical waveguide structure according to claim 1, wherein equations "1 μm $\leq W_{wg} \leq$ 3 μm and 2 μm $\leq W_{mesa} \leq$ 4 μm" are satisfied.

5. The optical waveguide structure according to claim 1, wherein
the optical guide layer is made of GaInAsP, and
the lower cladding layer and the upper cladding layer are made of InP.

6. The optical waveguide structure according to claim 1, further comprising a diffraction grating layer that is positioned either on side of the upper cladding layer or on side of lower cladding layer with respect to the optical guide layer.

7. The optical waveguide structure according to claim 1, further comprising a low thermal conductivity area that is positioned on side of the substrate with respect to the optical guide layer.

8. The optical waveguide structure according to claim 1, further comprising an active core layer that is connected to the optical guide layer.

9. The optical waveguide structure according to claim 8, wherein mode field radius or propagation constant of light having predetermined wavelength and propagating through the active core layer is different than mode field radius or propagation constant of light having the predetermined wavelength and propagating through the optical guide layer.

10. The optical waveguide structure according to claim 9, wherein the active core layer and the optical guide layer are connected via a mode field conversion structure.

11. The optical waveguide structure according to claim 1, wherein
both sides of the optical guide layer are buried by a current-blocking structure,
a width of the upper cladding layer is equal to a width defined by the optical guide layer and the current-blocking structure on the both sides.

12. The optical waveguide structure according to claim 1, wherein
at least either
the optical guide layer is connected to an optical waveguide structure portion of a buried structure, or
the optical guide layer has a linear shape, or
the optical waveguide structure includes a diffraction grating layer, and an equation "$W_{wg}=W_{mesa}$" is satisfied.

13. The optical waveguide structure according to claim 1, wherein an equation "$W_{wg}<W_{mesa}$" is satisfied.

14. The optical waveguide structure according to claim 1, wherein $W_{mesa}$ greater than 4 μm, and equal to or less than 6 μm.

* * * * *